United States Patent
Jeon et al.

(10) Patent No.: US 10,234,739 B2
(45) Date of Patent: Mar. 19, 2019

(54) THIN FILM TRANSISTOR SUBSTRATE AND DISPLAY APPARATUS

(71) Applicant: Samsung Display Co., Ltd., Yongin-si, Gyeonggi-do (KR)

(72) Inventors: Yeonmun Jeon, Yongin-si (KR); Minchul Song, Yongin-si (KR); Seongsu Lim, Yongin-si (KR); Yanghee Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 125 days.

(21) Appl. No.: 15/344,224

(22) Filed: Nov. 4, 2016

(65) Prior Publication Data

US 2017/0168332 A1 Jun. 15, 2017

(30) Foreign Application Priority Data

Dec. 10, 2015 (KR) .................. 10-2015-0176024

(51) Int. Cl.
*G02F 1/1368* (2006.01)
*G02F 1/1343* (2006.01)
(Continued)

(52) U.S. Cl.
CPC ........ *G02F 1/1368* (2013.01); *G02F 1/13439* (2013.01); *G02F 1/134309* (2013.01);
(Continued)

(58) Field of Classification Search
CPC ............. G02F 1/134309; G02F 1/1368; G02F 1/13439; H01L 27/1222; H01L 29/0847;
(Continued)

(56) References Cited

U.S. PATENT DOCUMENTS

| 6,014,190 | A | * | 1/2000 | Kim | .................. | G02F 1/134363 |
|---|---|---|---|---|---|---|
| | | | | | | 349/139 |
| 2006/0087599 | A1 | * | 4/2006 | Sohn | .................. | G02F 1/13454 |
| | | | | | | 349/43 |
| 2008/0296575 | A1 | * | 12/2008 | Li | ..................... | H01L 29/41733 |
| | | | | | | 257/59 |
| 2009/0302320 | A1 | * | 12/2009 | Takahashi | .......... | H01L 27/1288 |
| | | | | | | 257/59 |
| 2011/0147756 | A1 | | 6/2011 | Moriguchi et al. | | |

(Continued)

FOREIGN PATENT DOCUMENTS

| JP | 2010-272664 | 12/2010 |
|---|---|---|
| KR | 10-2008-0053701 | 6/2008 |

(Continued)

*Primary Examiner* — Hoan C Nguyen
(74) *Attorney, Agent, or Firm* — Lewis Roca Rothgerber Christie LLP

(57) ABSTRACT

A thin film transistor substrate includes a substrate and thin film transistors arranged in first and second directions above the substrate. Each thin film transistor includes a gate electrode, a drain electrode, a source electrode and a semiconductor layer. The drain electrode is above the gate electrode and includes a first drain oblique portion and a second drain oblique portion extending from an end portion of the first drain oblique portion. The source electrode is spaced apart from the drain electrode above the gate electrode and includes a first source oblique portion and a second source oblique portion extending from an end portion of the first source oblique portion. The semiconductor layer at least partially overlaps the gate electrode and includes a drain region to which the drain electrode is connected, a source region to which the source electrode is connected, and a channel region therebetween.

19 Claims, 8 Drawing Sheets

(51) Int. Cl.
*G09G 3/36* (2006.01)
*H01L 27/12* (2006.01)
*H01L 29/08* (2006.01)
*G02F 1/1362* (2006.01)

(52) U.S. Cl.
CPC ..... *G02F 1/136286* (2013.01); *G09G 3/3688* (2013.01); *G09G 3/3696* (2013.01); *H01L 27/124* (2013.01); *H01L 27/1222* (2013.01); *H01L 27/1225* (2013.01); *H01L 29/0847* (2013.01); *G09G 2300/0426* (2013.01); *G09G 2310/08* (2013.01)

(58) Field of Classification Search
CPC ............... G09G 3/3696; G09G 3/3688; G09G 2310/08; G09G 2300/0426
USPC .......................................................... 349/43
See application file for complete search history.

(56) References Cited

U.S. PATENT DOCUMENTS

| 2011/0158894 | A1* | 6/2011 | Lee ..................... B82Y 30/00 423/447.1 |
| 2012/0169576 | A1* | 7/2012 | Wang .................. G02F 1/13394 345/88 |
| 2013/0161752 | A1 | 6/2013 | Koo |
| 2014/0306191 | A1* | 10/2014 | Lee ..................... H01L 27/3225 257/40 |
| 2014/0313446 | A1* | 10/2014 | Kubota ................ G02F 1/1368 349/43 |

FOREIGN PATENT DOCUMENTS

| KR | 10-2013-0071687 | 7/2013 |
| KR | 10-2014-0076997 | 6/2014 |

* cited by examiner

THIN FILM TRANSISTOR SUBSTRATE AND DISPLAY APPARATUS

CROSS-REFERENCE TO RELATED APPLICATION

This application claims the benefit of Korean Patent Application No. 10-2015-0176024, filed on Dec. 10, 2015, in the Korean Intellectual Property Office, the disclosure of which is incorporated herein in its entirety by reference.

BACKGROUND

Field

One or more embodiments relate to a thin film transistor substrate and a display apparatus.

Description of the Related Technology

Display apparatuses display an image using a plurality of pixels. The pixels include a pixel electrode connected to a thin film transistor (TFT), and a common electrode receiving a common voltage. The TFT is turned on in response to a gate signal. A turned-on TFT transmits a received data voltage to the pixel electrode. An electrode field is formed by the pixel electrode, to which the data voltage is applied, and the common electrode, to which the common voltage is applied. A liquid crystal layer is driven by the electric field so that an image is displayed.

A light shielding layer for shielding light output from a backlight from being irradiated to the outside via a TFT of a liquid crystal display apparatus is on the thin film transistor TFT. An aperture ratio, that is, a ratio of an area where light is irradiated to display an image to a total area of a display apparatus, is limited by the light shielding layer. As a resolution of the display apparatus increases, the aperture ratio gradually decreases.

SUMMARY OF CERTAIN INVENTIVE ASPECTS

Additional aspects will be set forth in part in the description which follows and, in part, will be apparent from the description, or may be learned by practice of the presented embodiments.

According to one or more embodiments, a thin film transistor substrate includes a substrate, and a plurality of thin film transistors arranged in a first direction and a second direction above the substrate, in which each of the plurality of thin film transistors includes: a gate electrode on the substrate, a drain electrode above the gate electrode, and comprising a first drain oblique portion extending in a direction between the first direction and the second direction and a second drain oblique portion extending from an end portion of the first drain oblique portion in a direction between a direction opposite to the first direction and the second direction, a source electrode spaced apart from the drain electrode above the gate electrode, and comprising a first source oblique portion extending in the direction between the first direction and the second direction and a second source oblique portion extending from an end portion of the first source oblique portion in a direction between the direction opposite to the first direction and the second direction, and a semiconductor layer at least partially overlapping the gate electrode, and comprising a drain region to which the drain electrode is connected, a source region to which the source electrode is connected, and a channel region between the drain region and the source region.

Plane shapes of the drain electrode and the source electrode viewed in a third direction perpendicular to the first and second directions may be a left angle bracket "<" or a right angle bracket ">".

A plane shape of the drain electrode viewed in a third direction perpendicular to the first and second directions may correspond to a plane shape of the source electrode viewed in the third direction.

The source electrode may be spaced apart from the drain electrode in the first direction.

The drain electrode may further include a third drain oblique portion extending from an end portion of the second drain oblique portion in the direction between the first direction and the second direction, and the source electrode may further include a first source oblique portion extending from an end portion of the second source oblique portion in the direction between the first direction and the second direction.

Plane shapes of the drain electrode and the source electrode viewed in the third direction perpendicular to the first and second directions may be zigzag.

An angle between a direction in which each of the first and second drain oblique portions and the first and second source oblique portions may extend and the second direction may be between about 30° and about 60°.

According to one or more embodiments, a display apparatus includes a substrate, a plurality of thin film transistors arranged in a first direction and a second direction above the substrate, and a plurality of pixels comprising the plurality of thin film transistors, in which each of the plurality of thin film transistors includes a gate electrode on the substrate, a drain electrode above the gate electrode, and comprising a first drain oblique portion extending in a direction between the first direction and the second direction and a second drain oblique portion extending from an end portion of the first drain oblique portion in a direction between a direction opposite to the first direction and the second direction, a source electrode spaced apart from the drain electrode above the gate electrode, and comprising a first source oblique portion extending in the direction between the first direction and the second direction and a second source oblique portion extending from an end portion of the first source oblique portion in a direction between the direction opposite to the first direction and the second direction, and a semiconductor layer at least partially overlapping the gate electrode, and comprising a drain region to which the drain electrode is connected, a source region to which the source electrode is connected, and a channel region between the drain region and the source region.

Shapes of the drain electrode and the source electrode viewed in a third direction perpendicular to the first and second directions may be a left angle bracket "<" or a right angle bracket ">".

The drain electrode may further include a third drain oblique portion extending from an end portion of the second drain oblique portion in the direction between the first direction and the second direction, and the source electrode may further include a first source oblique portion extending from an end portion of the second source oblique portion in the direction between the first direction and the second direction.

Plane shapes of the drain electrode and the source electrode viewed in the third direction perpendicular to the first and second directions may be zigzag.

The display apparatus may further include a plurality of gate lines extending in the first direction and connecting gate electrodes of thin film transistors arranged in the first direction among the plurality of thin film transistors, and a plurality of data lines extending in the second direction and connecting drain electrodes of thin film transistors arranged in the second direction among the plurality of thin film transistors.

Each of the plurality of data lines may include a plurality of data linear portions linearly extending in the second direction, and each of the plurality of data linear portions may be between drain electrodes of two neighboring thin film transistors among the plurality of transistors.

Each of the plurality of data lines may include a plurality of connection portions connecting drain electrodes of two neighboring thin film transistors among the plurality of thin film transistors in the second direction, and each of the plurality of connection portions may include a first data oblique portion extending from an end portion of a second drain oblique portion of a drain electrode of a first thin film transistor of the two neighboring thin film transistors in a direction opposite to the first direction and the second direction, and a second data oblique portion extending from an end portion of the first drain oblique portion to an end portion of a first drain oblique portion of a drain electrode of a second thin film transistor of the two neighboring thin film transistors in a direction between the first direction and the second direction.

An angle between a direction in which the second drain oblique portion may extend and the second direction may be greater than an angle between a direction in which the first data oblique portion extends and the second direction, and an angle between a direction in which the first drain oblique portion may extend and the second direction may be greater than an angle between a direction in which the second data oblique portion extends and the second direction.

An angle between a direction in which the second drain oblique portion may extend and the second direction may be the same as an angle between a direction in which the first data oblique portion extends and the second direction, and an angle between a direction in which the first drain oblique portion may extend and the second direction may be the same as an angle between a direction in which the second data oblique portion extends and the second direction.

A plane shape of the drain electrode viewed in a third direction perpendicular to the first and second directions may correspond to a plane shape of the source electrode viewed in the third direction, and the source electrode may be spaced apart from the drain electrode in the first direction.

A plane shape of the drain electrode viewed in a third direction perpendicular to the first and second directions may correspond to a plane shape of the source electrode viewed in the third direction, and the source electrode may be spaced apart from the drain electrode in a direction opposite to the first direction.

Each of the plurality of thin film transistors may be arranged in a center area of a pixel corresponding to the thin film transistor among the plurality of pixels.

The display apparatus may further include a plurality of pixel electrodes respectively connected to source electrodes of the plurality of thin film transistors and included in the plurality of pixels, and a liquid crystal layer on the plurality of pixel electrodes.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Figure 1:
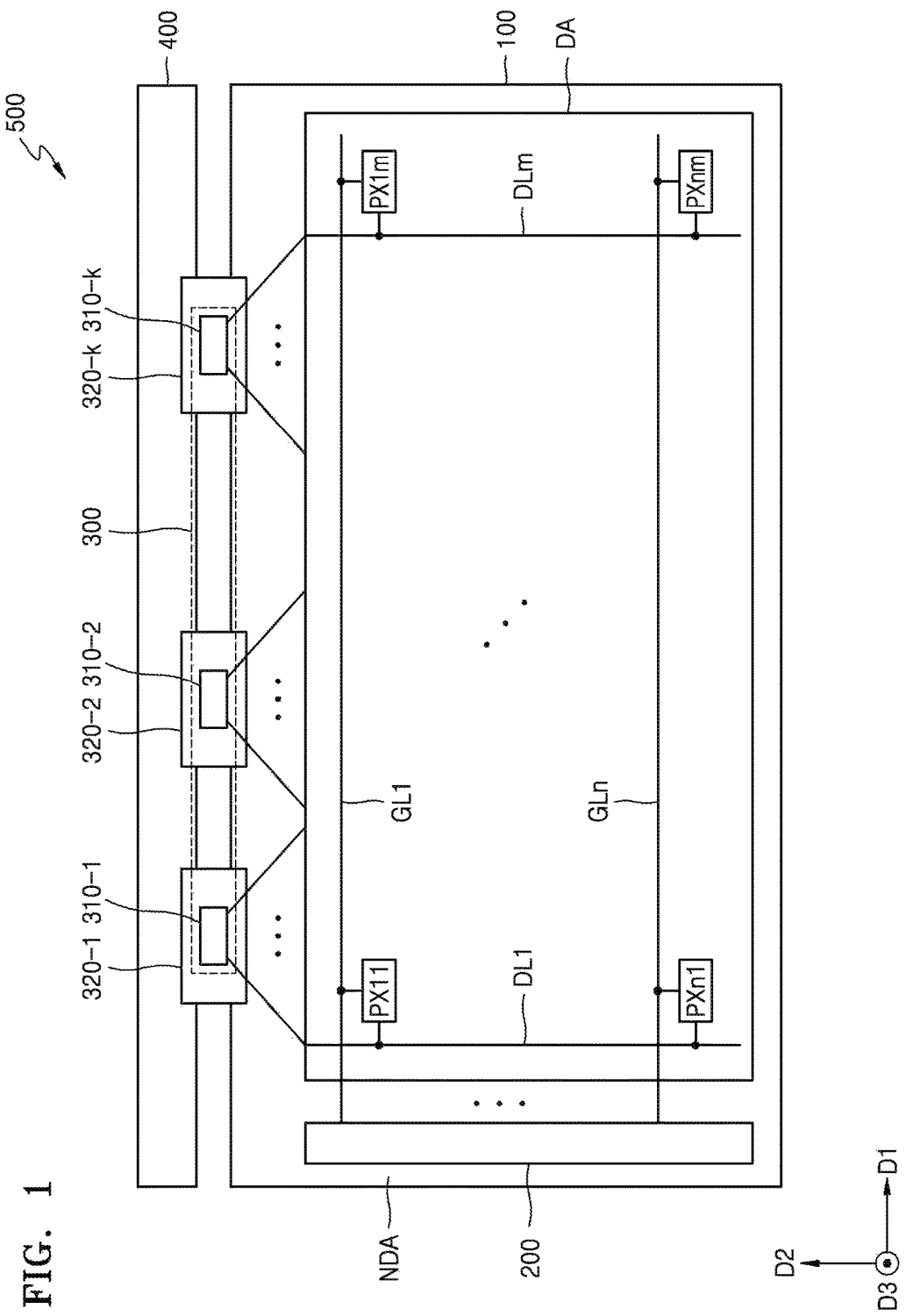
FIG. 1 is a plan view schematically illustrating a display apparatus according to an embodiment.

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In some embodiments, well-known processes, well-known structures and well-known technologies will not be specifically described in order to avoid ambiguous interpretation of the present invention. Like reference numerals generally refer to like elements throughout the specification.

It will be understood that when an element or layer is referred to as being "on" another element or layer, the element or layer can be directly on another element or layer or intervening elements or layers may be present. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or components would then be oriented "above" the other elements or components. Thus, the example term "below" or "beneath" can encompass both an orientation of above and below. The device may be otherwise oriented and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Embodiments of the invention are described herein with reference to plan and cross-section illustrations that are schematic illustrations of idealized embodiments and intermediate structures of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

FIG. 1 is a plan view schematically illustrating a display apparatus 500 according to an embodiment.

Referring to FIG. 1, the display apparatus 500 may include a display panel 100, a gate driver 200, a data driver 300, and a drive circuit substrate 400.

The display panel 100 may include a plurality of pixels PX11~PXnm, a plurality of gate lines GL1~GLn, and a plurality of data lines DLP~DLm. The display panel 100 may include a display area DA and a non-display area NDA surrounding the display area DA.

The pixels PX11~PXnm are arranged in a matrix form in the display area DA along a first direction D1 and a second direction D2. For example, the pixels PX11~PXnm may be arranged in n-number of rows and m-number of columns crossing each other. "m" and "n" are integers greater than 0. Although the first direction D1 is indicated as a direction from the left to the right in FIG. 1, this is just an example, and the first direction D1 may be a direction from the right to the left. Although the second direction D2 is indicated as a direction from the top to the bottom in FIG. 1, this is just an example, and the second direction D2 may be a direction from the bottom to the top. A third direction D3 may be defined to be a direction perpendicular to the first direction D1 and the second direction D2.

The gate lines GL1~GLn and the data lines DLP~DLm cross each other and are insulated from each other. The gate lines GL1~GLn extending in the first direction D1 are connected to the gate driver 200 and receive gate signals from the gate driver 200. The data lines DLP~DLm extending in the second direction D2 are connected to the data driver 300 and receive data voltages in an analog form from the data driver 300.

The pixels PX11~PXnm are connected to the corresponding gate lines GL1~GLn and to the corresponding data lines DLP~DLm. The pixels PX11~PXnm, in response to the gate signals transmitted via the corresponding gate lines GL1~GLn, receive data voltages via the corresponding data lines DLP~DLm. The pixels PX11~PXnm display a gradation corresponding to the data voltages.

The gate driver 200, in response to a gate control signal output from a timing controller (not shown) mounted on the drive circuit substrate 400, generates gate signals and provides the gate signals to the pixels PX11~PXnm sequentially and in units of rows via the gate lines GL1~GLn.

The gate driver 200 may be arranged in the non-display area NDA adjacent to the display area DA. Although the gate driver 200 is illustrated to be arranged at the left side of the display area DA, this is just an example, and the gate driver 200 may be arranged in the non-display area NDA adjacent to the right side or one or more sides of the display area DA.

The gate driver 200 may include a plurality of gate driving chips (not shown). The gate driving chips may be mounted in the non-display area NDA adjacent to the left side of the display area DA in a chip-on-glass (COG) method. However, the present disclosure is not limited thereto and the gate driving chips may be connected to the non-display area NDA adjacent to the display area DA in a tape carrier package (TCP) method, or another method.

The data driver 300 receives image signals and data control signals from the timing controller. The data driver 300, in response to the data control signal, generates analog data voltages corresponding to image signals. The data driver 300 provides the data voltages to the pixels PX11~PXnm via the data lines DLP~DLm.

The data driver 300 may include a plurality of source driving chips 310-1~310-$k$. "$k$" is an integer greater than 0 and less than "m". The source driving chips 310-1~310-$k$ are mounted on flexible circuit substrates 320-1~320-$k$ corresponding thereto and connected to the non-display area NDA adjacent to the display area DA via the drive circuit substrate 400. Although the data driver 300 is illustrated to be connected to the non-display area NDA adjacent to the upper side of the display area DA, this is just an example, and the data driver 300 may be connected to the non-display area NDA adjacent to the lower side or both sides of the display area DA via the drive circuit substrate 400.

The data driver 300 may be connected to the display panel 100 by the TCP method. However, the present disclosure is not limited thereto and the source driving chips 310-1~310-$k$ may be mounted in the non-display area NDA adjacent to the upper side of the display area DA by the COG method, or another method.

Although not illustrated, the data lines DLP~DLm may be connected to the source driving chips 310-1~310-$k$ via pad electrodes arranged in the non-display area NDA. Furthermore, the gate lines GL1~GLn may be connected to the gate driver 200 via the pad electrodes arranged in the non-display area NDA.

Figure 2:
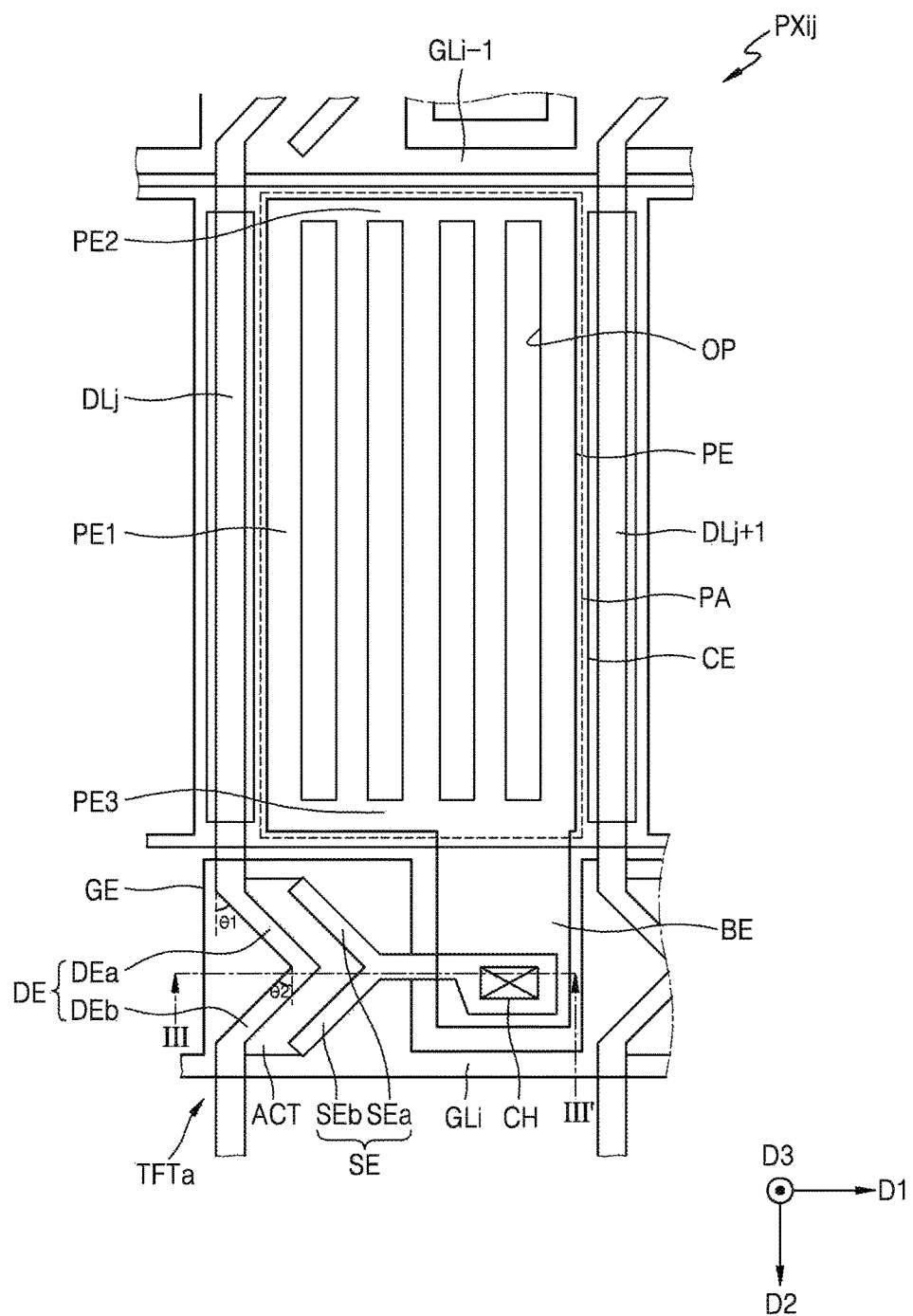
FIG. 2 is a plan view of a pixel including a thin film transistor (TFT) according to an embodiment.

FIG. 2 is a plan view of a pixel including a TFT according to an embodiment.

Although FIG. 2 illustrates a single pixel PXij as an example, other pixels illustrated in FIG. 1 may have the same structure. For convenience of explanation, a structure of the pixel PXij is described below.

Referring to FIG. 2, an area on a plane of the pixel PXij may include a pixel area PA and a non-pixel area around the pixel area PA. The pixel area PA may be defined to be an area where light having a gradation is irradiated to display an image, whereas the non-pixel area may be defined to be an area where no light is irradiated. The non-pixel area may be defined to be an area between the pixel areas PA. To prevent irradiation of light through the non-pixel area, a light shielding member (not shown) such as a black matrix may be above or under the non-pixel area.

Gate lines GLi-1 and GLi and data lines DLj and DLj+1 are arranged in the non-pixel area NPA. The gate lines GLi-1 and GLi extend in the first direction D1. The data lines DLj and DLj+1 extend in the second direction D2 crossing the first direction D1 and cross the gate lines GLi-1 and GLi, and are insulated from each other.

The pixel PXij may include a thin film transistor TFTa and a pixel electrode PE connected to the thin film transistor TFTa. The thin film transistor TFTa is arranged in the non-pixel area NPA. The pixel electrode PE is mostly arranged in the pixel area PA. The thin film transistor TFTa is connected to the corresponding gate line GLi and the corresponding data line DLj.

The thin film transistor TFTa may include a gate electrode GE connected to the gate line GLi, a drain electrode DE connected to the data line DLj, a source electrode SE connected to the pixel electrode PE, and a semiconductor layer ACT for forming a channel of the thin film transistor TFTa.

The gate electrode GE is branched from the gate line GLi. The gate line GLi electrically connects the gate electrodes GE of the thin film transistors TFTa arranged in the first direction D1. The gate electrode GE may be integrally formed with the gate line GLi.

The drain electrode DE may include a first drain oblique portion DEa extending in a direction between the first direction D1 and the second direction D2 and a second drain oblique portion DEb extending from an end portion of the first drain oblique portion DEa in a direction between a direction opposite to the first direction D1 and the second direction D2. As illustrated in FIG. 2, a plane shape of the drain electrode DE viewed in a third direction D3 may be a right angle bracket ">". However, the present disclosure is not limited thereto, and the plane shape of the drain electrode DE may be a left angle bracket "<".

An angle θ1 between a direction in which the first drain oblique portion DEa extends and the second direction D2 may be selected between about 30° and about 60°. The angle θ1 may be about 45°. Furthermore, an angle θ2 between a direction in which the second drain oblique portion DEb extends and the second direction D2 may be selected between about 30° and about 60°. The angle θ2 may be about 45°.

The drain electrode DE may be integrally formed with the data line DLj. In this case, the drain electrode DE may be defined to be a part of the data line DLj at least partially overlapping the gate electrode GE. Furthermore, the data line DLj may be defined to include connection portions to connect the drain electrodes DE of the thin film transistors TFTa neighboring in the second direction D2. The connection portions may be referred to as data linear portions linearly extending in the second direction D2, as illustrated in FIG. 2.

The source electrode SE is spaced apart from the drain electrode DE above the gate electrode GE. As illustrated in FIG. 2, a plane shape of the source electrode SE viewed in the third direction D3 may correspond to a plane shape of the drain electrode DE. Furthermore, the source electrode SE may be spaced apart from the drain electrode DE in the first direction D1. In another embodiment, the source electrode SE may be spaced apart from the drain electrode DE in the direction opposite to the first direction D1.

Similar to the drain electrode DE, the source electrode SE may include a first source oblique portion SEa extending in a direction between the first direction D1 and the second direction D2 and a second source oblique portion SEb extending from an end portion of the first source oblique portion SEa in a direction between the direction opposite to the first direction D1 and the second direction D2. As illustrated in FIG. 2, a plane shape of the source electrode SE may be a right angle bracket ">" corresponding to the plane shape of the drain electrode DE. In another embodiment, the plane shape of the source electrode SE may be a left angle bracket "<" corresponding to the plane shape of the drain electrode DE.

Each of an angle θ1 between a direction in which the first source oblique portion SEa extends and the second direction D2 and an angle θ2 between a direction in which the second source oblique portion SEb extends and the second direction D2 may be selected between about 30° and about 60°. Each of the angle θ1 and angle θ2 may be about 45°.

The semiconductor layer ACT may be arranged above the gate electrode GE at least partially overlapping the gate electrode GE. The semiconductor layer ACT may include a drain region to which the drain electrode DE is connected, a source region to which the source electrode SE is connected, and a channel region between the drain region and the source region.

The channel region may have a shape of a right angle bracket ">" corresponding to the plane shape of the drain electrode DE and the source electrode SE. Accordingly, when the plane shape of the channel region is an angle bracket, a length of the thin film transistor TFTa in the second direction D2 may be reduced even if a channel width is the same, compared to a case of an "I" shape. A width of the non-pixel area NPA between the pixel areas PA neighboring in the second direction D2 is limited by the length of the thin film transistor TFTa in the second direction D2. In an embodiment, as the drain electrode DE, the source electrode SE, and the channel region are formed in an angle bracket shape, the length of the thin film transistor TFTa in the second direction D2 may be reduced and thus an entire area of the non-pixel area NPA may be reduced. Accordingly, an area of the pixel area PA may be relatively increased and thus an aperture ratio of the display panel 100 may be improved.

The pixel electrode PE extends toward the non-pixel area NPA to be connected to the source electrode SE of the thin film transistor TFTa via a contact hole CH. A branch electrode BE branched from the pixel electrode PE is connected to the source electrode SE of the thin film transistor TFTa via the contact hole CH. The branch electrode BE is arranged in the non-pixel area NPA.

A plurality of openings OP may be formed in the pixel electrode PE. The pixel electrode PE may include a plurality of branch electrodes PE1 defined by the openings OP, a first connection portion PE2, and a second connection portion PE3. The branch electrodes PE1 extend in the second direction D2 at the same separation distance. The first and second connection portions PE2 and PE3 extend in the first direction D1. The first connection portion PE2 connects one ends of the branch electrodes PE1, whereas the second connection portion PE3 connects the other ends of the branch electrodes PE1.

Although not illustrated, the data line DLj extends in the second direction D2 to be electrically connected to the source driving chips 310-1~310-k. Accordingly, the data voltage output from the source driving chips 310-1~310-k may be applied to the data line DLj. Furthermore, the gate line GLi extends in the first direction D1 to be electrically connected to the gate driver 200. The gate signal output from the gate driver 200 may be applied to the gate line GLi.

A common electrode CE may be arranged in the pixel PXij. A common voltage is applied to the common electrode CE. The common electrode CE may be arranged between a substrate and the pixel electrode PE. In another embodiment, the common electrode CE may be arranged on an opposing substrate, and a liquid crystal layer may be arranged between the common electrode CE and the pixel electrode PE.

Figure 3:
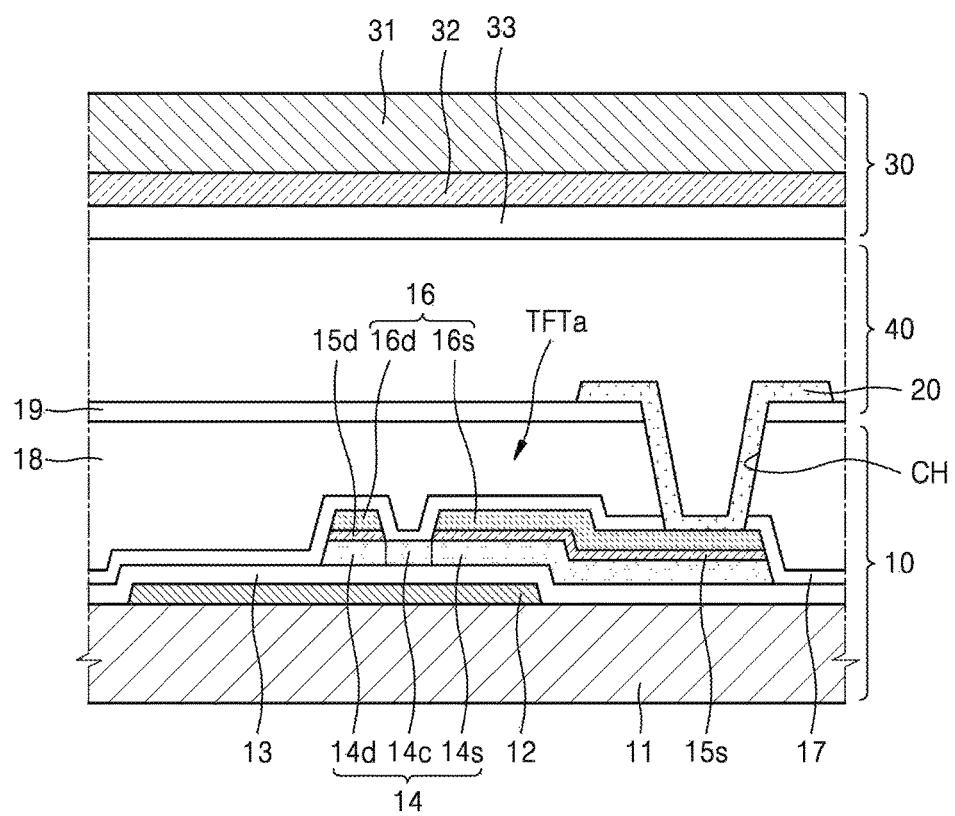
FIG. 3 is a cross-sectional view taken along a line of FIG. 2.

FIG. 3 is a cross-sectional view taken along a line III-III' of FIG. 2.

Referring to FIG. 3 with FIG. 2, the display panel 100 may include a lower display panel 10 and an the upper display panel 30, facing each other, and a liquid crystal layer 40 injected between the lower and upper display panels 10 and 30. The display panel 100 may be a liquid crystal display panel.

The lower display panel 10 may include a first substrate 11, the thin film transistor TFTa, and the pixel electrode PE. The lower display panel 10 may be referred to as a TFT substrate. The pixels PX11~PXnm may be arranged on the lower display panel 10.

The first substrate 11 may include transparent glass or plastic.

A gate conductor 12 including the gate line GLi and the gate electrode GE may be arranged on the first substrate 11. The gate conductor 12 illustrated in FIG. 3 corresponds to the gate electrode GE. The gate conductor 12 may include aluminum-based metal such as aluminum (Al) or an aluminum alloy, silver-based metal such as silver (Ag) or a silver alloy, copper-based metal such as copper (Cu) or a copper alloy, molybdenum-based metal such as molybdenum (Mo) or a molybdenum alloy, chrome (Cr), tantalum (Ta), titanium (Ti), etc. The gate conductor 12 may have a multilayer structure including at least two conductive layers having different physical properties.

A gate insulating layer 13 may be arranged over the gate conductor 12. The gate insulating layer 13 may include silicon nitride (SiNx) or silicon oxide (SiOx). The gate insulating layer 13 may have a multilayer structure including at least two conductive layers having different physical properties.

A semiconductor layer ACT 14 may be arranged on the gate insulating layer 13. The semiconductor layer 14 may include amorphous silicon or polycrystalline silicon. In another embodiment, the semiconductor layer 14 may include oxide semiconductor. The oxide semiconductor may include indium-gallium-zinc oxide (IGZO). The semiconductor layer 14 may include a drain region 14$d$ to which the drain electrode DE is connected, a source region 14$s$ to which the source electrode SE is connected, and a channel region 14$c$ between the drain region 14$d$ and the source region 14$s$.

Resistive contact members 15$d$ and 15$s$ may be arranged on the semiconductor layer 14. The resistive contact members 15$d$ and 15$s$ may include silicide or a material such as n+ hydrogenated amorphous silicon doped with n-type impurities such as phosphorus at a high concentration. The resistive contact members 15$d$ and 15$s$ may be arranged on the drain region 14$d$ and the source region 14$s$ of the semiconductor layer 14. When the semiconductor layer 14 is an oxide semiconductor, the resistive contact members 15$d$ and 15$s$ may be omitted in some embodiments.

A data conductor 16 may be arranged on the gate insulating layer 13 and the resistive contact members 15$d$ and 15$s$. The data conductor 16 may include the data line DLj including the drain electrode DE 16$d$, and the source electrode SE 16$s$.

As described above, the drain electrode DE may include the first drain oblique portion DEa extending in a direction between the first direction D1 and the second direction D2, and the second drain oblique portion DEb extending from the end portion of the first drain oblique portion DEa in a direction between the direction opposite to the first direction D1 and the second direction D2. Furthermore, the source electrode SE may include the first source oblique portion SEa extending in a direction between the first direction D1 and the second direction D2, and a second source oblique portion SEb extending from the end portion of the first source oblique portion SEa in a direction between the direction opposite to the first direction D1 and the second direction D2.

The data line DLj transmits a data signal to the thin film transistor TFTa and extends in the second direction D2, crossing a gate line GLi extending in the first direction D1. The data line DLj may include the connection portion between the drain electrodes DE. The connection portion may have a linear shape extending in the second direction D2 as illustrated in FIG. 2. In another embodiment, the connection portion may have a bent shape to increase an aperture ratio of the display panel 100. In this regard, detailed descriptions are provided below with reference to FIGS. 5 to 8.

The gate electrode GE, the drain electrode DE, and the source electrode SE, with the semiconductor layer ACT 14, form a single thin film transistor TFTa. A channel of the thin film transistor TFTa is formed in a channel region 14$c$ between the drain electrode DE and the source electrode SE.

The data conductor 16 may include refractory metal such as molybdenum, chrome, tantalum, or titanium, or an alloy thereof. The data conductor 16 may have a multilayer structure including a refractory metal layer (not shown) and a low resistive conductive layer (not shown). For example, the data conductor 16 may have a dual layer structure including a lower layer including chrome or molybdenum or an alloy thereof and an upper layer including aluminum or an alloy thereof. In another embodiment, the data conductor 16 may have a triple layer structure of a lower layer including molybdenum or an alloy thereof, an intermediate layer including aluminum or an alloy thereof, and an upper layer including molybdenum or an alloy thereof. However, in addition thereto, the data conductor 16 may include other various metals or conductors. A width of the data line DLj may be about 3.5±0.75 μm.

A first protective layer 17 may be arranged on exposed portions of the data conductor 16, the gate insulating layer 13, and the semiconductor layer 14, for example, over the channel region 14$c$. The first protective layer 17 may include an organic insulating material or an inorganic insulating material.

A second protective layer 18 may be arranged on the first protective layer 17. The second protective layer 18 may be omitted in some embodiments. In an embodiment, the second protective layer 18 may be a color filter. When the second protective layer 18 is a color filter, the second protective layer 18 may display one of primary colors. For example, the second protective layer 18 may be a color filter for selectively passing only one of red, green, and blue lights. In another embodiment, the second protective layer 18 may be a color filter for selectively passing only one of yellow, cyan, and magenta lights.

The common electrode CE may be arranged on the second protective layer 18. The common electrode CE is arranged in a panel form in the pixel area PA as illustrated in FIG. 2, whereas only the connection portions to connect the common electrodes CE over the pixel area PA may be arranged in the non-pixel area NPA. The common electrode CE may receive the common voltage of a certain size supplied from the outside of the display area DA. In another embodiment, the common electrode CE may be formed on an entire surface of the first substrate 11.

A third protective layer 19 may be arranged on the common electrode CE. The third protective layer 19 may include an organic insulating material or an inorganic insulating material.

The pixel electrode PE and the branch electrode BE 20 may be arranged on the third protective layer 19. The pixel electrode PE may have a plurality of openings OP and may include branch electrodes PE1 defined by the openings OP and the connection portions PE2 and PE3 to connect the branch electrodes PE1. The branch electrode BE 20 is a portion extending from the pixel electrode PE toward the non-pixel area NPA and connecting the pixel electrode PE to the source electrode SE 16s.

The pixel electrode PE and the branch electrode BE 20 may include a transparent conductive material. For example, the pixel electrode PE and the branch electrode BE 20 may include a transparent conductive metal oxide such as Indium tin oxide (ITO), indium zinc oxide (IZO), indium tin zinc oxide (ITZO).

The contact hole CH for exposing a part of the source electrode SE 16s is formed in the first protective layer 17, the second protective layer 18, and the third protective layer 19. The branch electrode BE 20 is electrically connected to the source electrode SE 16s via the contact hole CH.

Although not illustrated, an alignment layer may be arranged on the pixel electrode PE and the third protective layer 19. The alignment layer may be a horizontal alignment layer. The alignment layer includes a photoresponsive material and is optically aligned. A cyclobutane-based photodegradable material or an azobenzene-based photoisomerizable material may be used as an optically aligned alignment layer, for example.

The upper display panel 30 may include a second substrate 31 and a light shielding member 32.

The second substrate 31 may include transparent glass or plastic. The light shielding member 32 may be arranged on the second substrate 31. The light shielding member 32 may be referred to as a black matrix, and prevents light leak.

A plurality of color filters (not shown) may be arranged on the second substrate 31. The color filters may be arranged to correspond to the pixel area PA. The color filter may transmit light of only one color of the primary colors. When the second protective layer 18 of the lower display panel 10 is a color filter, the color filter may be omitted in the upper display panel 30 in some embodiments. Furthermore, the light shielding member 32 of the upper display panel 30 may be also arranged on the lower display panel 10.

An overcoat 33 may be arranged on the light shielding member 32 and the color filter. The overcoat 33 includes an insulating material, prevents the color filter from being exposed, and provides a planar surface. The overcoat 33 may be omitted in some embodiments.

The alignment layer maybe arranged on the overcoat 33. The alignment layer may be a horizontal alignment layer. The alignment layer may include a photoresponsive material and may be optically aligned.

The liquid crystal layer 40 may include a nematic liquid crystal material having a positive dielectric anisotropy. Liquid crystal molecules of the liquid crystal layer 40 may have a structure in which the major-axis direction of the liquid crystal molecules is parallel to the lower and upper display panels 10 and 30, and the major-axis direction of the liquid crystal molecules is spirally twisted by about 90° from the alignment direction of the alignment layer of the lower display panel 10 to the upper display panel 30.

The pixel electrode PE receives a data voltage via the data line DLj and the thin film transistor TFTa, whereas the common electrode CE may receive the common voltage of a constant amount from a common voltage applier (not shown) that is arranged outside the display area DA.

As the pixel electrode PE and the common electrode CE generate an electric field, the liquid crystal molecules of the liquid crystal layer 40 located above the pixel electrode PE and the common electrode CE are rotated in a direction parallel to the direction of the electric field. Polarization of light passing through the liquid crystal layer 40 varies according to a rotation direction of the liquid crystal molecules.

The display panel 100 may have a resolution of more than about 200 PPI. In other words, the display panel 100 may include about 200 or more pixels PX within an area of about 1 inch by 1 inch. One pixel PX may be about 40 μm or less in width and about 120 μm or less in height. In this state, the width of the pixel PX is defined by an interval between vertically center portions of two neighboring data lines DLj and DLj+1, whereas the height of the pixel PX may be defined by an interval between horizontally center portions of two neighboring gate lines GLi-1 and GLi.

Figure 4:
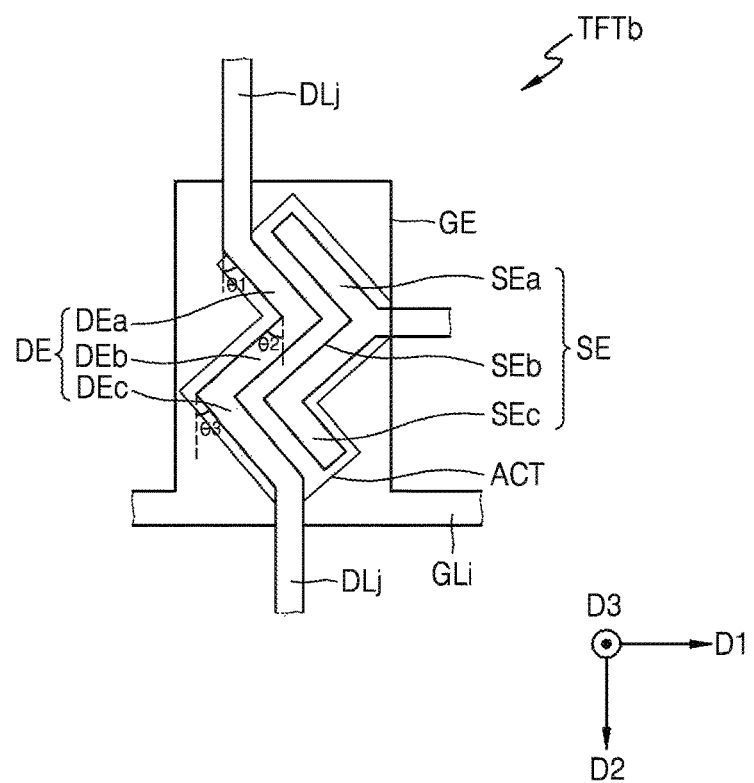
FIG. 4 is a plan view of a TFT according to another embodiment.

FIG. 4 is a plan view of a thin film transistor TFTb according to another embodiment.

Referring to FIG. 4, the thin film transistor TFTb may be arranged in the pixel PXij of FIG. 2. For example, the thin film transistor TFTa of FIG. 2 may be replaced with the thin film transistor TFTb of FIG. 4.

The TFTb may include the gate electrode GE, the drain electrode DE, the source electrode SE, and the semiconductor layer ACT. The gate electrode GE is connected to the gate line GLi, the drain electrode DE is connected to the data line DLj, and the source electrode SE is connected to the pixel electrode PE of FIG. 2.

The drain electrode DE may include the first drain oblique portion DEa extending in a direction between the first direction D1 and the second direction D2, the second drain oblique portion DEb extending from the end portion of the first drain oblique portion DEa in a direction between the direction opposite to the first direction D1 and the second direction D2, and a third drain oblique portion DEc extending from an end portion of the second drain oblique portion DEb in a direction between the first direction D1 and the second direction D2. The third drain oblique portion DEc may be arranged parallel to the first drain oblique portion DEa. In another embodiment, the drain electrode DE may have a shape of a left-right symmetry with respect to the drain electrode DE of FIG. 4.

The drain electrode DE may be integrally formed with the data line DLj. In this case, the drain electrode DE may be defined to be a part of the data line DLj at least partially overlapping the gate electrode GE. Furthermore, the data line DLj may be defined to include connection portions to connect the drain electrodes DE of the thin film transistors TFTb neighboring in the second direction D2. The first drain oblique portion DEa and the third drain oblique portion DEc of the drain electrode DE are respectively connected to the connection portions of the data line DLj.

The source electrode SE is arranged spaced apart from the drain electrode DE above the gate electrode GE. The source electrode SE may be arranged in the first direction D1 spaced apart from the drain electrode DE. In another embodiment, the source electrode SE may be arranged in the direction opposite to the first direction D1 spaced apart from the drain electrode DE.

The source electrode SE, similarly to the drain electrode DE, may include the first source oblique portion SEa extending in a direction between the first direction D1 and the second direction D2, the second source oblique portion SEb extending from an end portion of the first source oblique portion SEa in a direction between the direction opposite to the first direction D1 and the second direction D2, and a third source oblique portion SEc extending from an end portion of the second source oblique portion SEb in a direction between the first direction D1 and the second direction D2. The first source oblique portion SEa may be arranged parallel to the first drain oblique portion DEa, the second source oblique portion SEb may be arranged parallel to the second drain oblique portion DEb, and the third source oblique portion SEc may be arranged parallel to a third drain oblique portion DEc.

As illustrated in FIG. 4, a plane shape of the drain electrode DE and the source electrode SE viewed in the third direction D3 may be a zigzag shape.

An angle θ1 between a direction in which the first drain oblique portion DEa extends and the second direction D2 may be selected between about 30° and about 60°. An angle θ2 between a direction in which the second drain oblique portion DEb extends and the second direction D2 may be selected between about 30° and about 60°. An angle θ3 between a direction in which the third drain oblique portion DEc extends and the second direction D2 may be selected between about 30° and about 60°. For example, each of the angles θ1, θ2, and θ3 may be about 45°.

The semiconductor layer ACT is arranged above the gate electrode GE at least partially overlapping the gate electrode GE. The semiconductor layer ACT may include a drain region to which the drain electrode DE is connected, a source region to which the source electrode SE is connected, and a channel region between the drain region and the source region. The channel region may have a zigzag shape corresponding to a plane shape of the drain electrode DE and the source electrode SE. Accordingly, when the plane shape of the channel region is a zigzag shape, a length of the thin film transistor TFTb in the second direction D2 may be reduced even if a channel width is the same, compared to a case of an "I" shape.

A width of the non-pixel area NPA between the pixel areas PA neighboring in the second direction D2 is limited by the length of the thin film transistor TFTb in the second direction D2. In an embodiment, as the drain electrode DE, the source electrode SE, and the channel region are formed in a zigzag shape, the length of the thin film transistor TFTb in the second direction D2 and the width of the non-pixel area NPA may be reduced. Accordingly, an area of the pixel area PA may be relatively increased and thus an aperture ratio of the display panel 100 may be improved.

Figure 5:
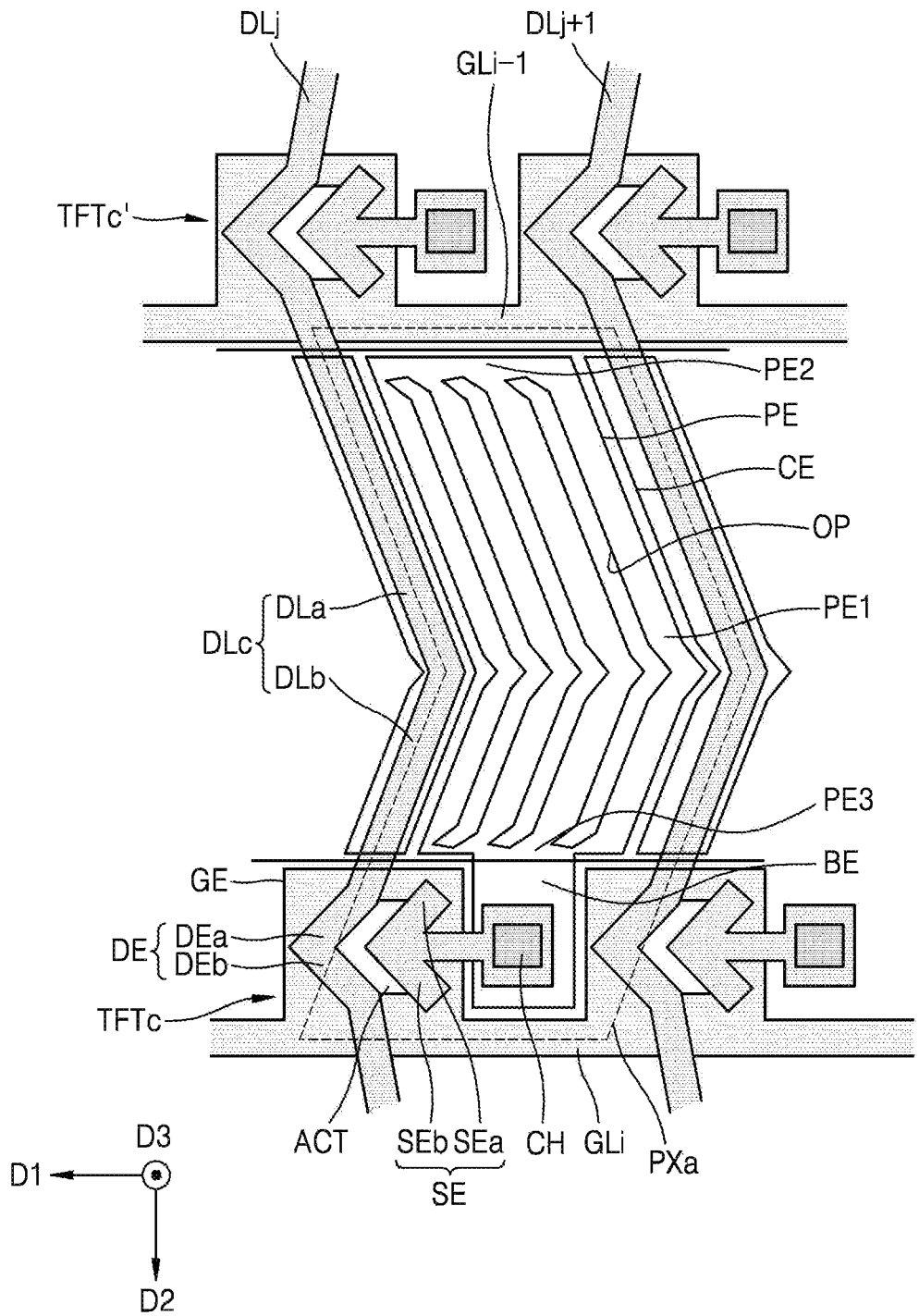
FIG. 5 is a plan view of a pixel including a TFT according to another embodiment.

FIG. 5 is a plan view of a pixel including a TFT according to another embodiment.

FIG. 5 illustrates an example of a single pixel PXa including a thin film transistor TFTc according to another embodiment. The pixel PXij of FIG. 2 may be replaced with the pixel PXa. The pixel PXa may have a structure similar to the structure of the pixel PXij of FIG. 2. In the following description, differences between the pixel PXa and the pixel PXij are mainly discussed and common descriptions thereof are omitted.

Referring to FIG. 5, the pixel PXa may include the thin film transistor TFTc and the pixel electrode PE. The pixel PXa is connected to the gate line GLi extending in the first direction D1 and the data line DLj extending in the second direction D2. In FIG. 5, the first direction D1 is defined to be a direction from the right to the left.

The thin film transistor TFTc may be arranged in the non-pixel area NPA. The thin film transistor TFTc may include the gate electrode GE connected to the gate line GLi, the drain electrode DE connected to the data line DLj, the source electrode SE connected to the pixel electrode PE, and the semiconductor layer ACT for forming a channel of the thin film transistor TFTc.

The gate electrode GE is branched from the gate line GLi. The gate line GLi electrically connects the gate electrodes GE of the thin film transistors TFTc arranged in the first direction D1. The gate electrode GE may be integrally formed with the gate line GLi.

The drain electrode DE may include the first drain oblique portion DEa extending in a direction between the first direction D1 and the second direction D2 and the second drain oblique portion DEb extending from the end portion of the first drain oblique portion DEa in a direction between the direction opposite to the first direction D1 and the second direction D2. As illustrated in FIG. 5, a plane shape of the drain electrode DE viewed in the third direction D3 may be a left angle bracket "<".

The source electrode SE is arranged spaced apart from the drain electrode DE above the gate electrode GE. As illustrated in FIG. 5, the plane shape of the source electrode SE viewed in the third direction D3 may correspond to the plane shape of the drain electrode DE. The source electrode SE may be arranged spaced apart from the drain electrode DE in the direction opposite to the first direction D1.

The source electrode SE may include the first source oblique portion SEa extending in a direction between the first direction D1 and the second direction D2, and the second source oblique portion SEb extending from the end portion of the first source oblique portion SEa in a direction between the direction opposite to the first direction D1 and the second direction D2. As illustrated in FIG. 5, the plane shape of the source electrode SE may correspond to the plane shape of the drain electrode DE and may be a left angle bracket "<".

The semiconductor layer ACT may be arranged above the gate electrode GE at least partially overlapping the gate electrode GE. The semiconductor layer ACT may include the drain region to which the drain electrode DE is connected, the source region to which the source electrode SE is connected, and the channel region between the drain region and the source region.

The channel region may have a shape of a right angle bracket ">" corresponding to the plane shape of the drain electrode DE and the source electrode SE. Accordingly, when the plane shape of the channel region is an angle bracket, a length of the thin film transistor TFTc in the second direction D2 may be reduced even if a channel width is the same, compared to a case of an "I" shape. Accordingly, the width of the non-pixel area NPA may be reduced and thus the aperture ratio of the display panel 100 may be improved.

The drain electrode DE may be integrally formed with the data line DLj. In this case, the drain electrode DE may be defined to be a part of the data line DLj at least partially overlapping the gate electrode GE. Furthermore, the data line DLj may be defined to include connection portions DLc to connect the drain electrodes DE of the thin film transistors TFTc neighboring in the second direction D2. Accordingly, the data line DLj may include the drain electrodes DE and the connection portions DLc.

As illustrated in FIG. 5, the data line DLj may have a bent shape to increase the aperture ratio of the display panel 100. The connection portion DLc may include a first data oblique portion DLa extending from an end portion of the second drain oblique portion DEb of the drain electrode DE of a first thin film transistor TFTc' of two neighboring thin film transistors TFTc and TFTc' in a direction between the direction opposite to the first direction D1 and the second direction D2, and a second data oblique portion DLb extending from an end portion of the first data oblique portion DLa to the end portion of the first drain oblique portion DEa of the drain electrode DE of a second thin film transistor TFTc of the two neighboring thin film transistors TFTc and TFTc' in a direction between the first direction D1 and the second direction D2. The first data oblique portion DLa and the second data oblique portion DLb meet in a middle area of the pixel PXa forming a V shape. In an embodiment, the first data oblique portion DLa may be inclined by about 7° with respect to the second direction D2, whereas the second data oblique portion DLb may be inclined by about −7° with respect to the second direction D2.

As illustrated in FIG. 5, the second drain oblique portion DEb may be inclined with respect to the second direction D2 more than the first data oblique portion DLa, and the first drain oblique portion DEa may be inclined with respect to the second direction D2 more than the second data oblique portion DLb.

The pixel electrode PE is mostly arranged in the pixel area PA. The pixel electrode PE extends toward the non-pixel area NPA and is connected to the source electrode SE of the thin film transistor TFTc via the contact hole CH. The branch electrode BE branched from the pixel electrode PE is connected to the source electrode SE of the thin film transistor TFTc via the contact hole CH. The branch electrode BE is arranged in the non-pixel area NPA.

The pixel electrode PE may have a curved edge corresponding to the connection portion DLc of the data line DLj.

A plurality of openings OP may be formed in the pixel electrode PE. The pixel electrode PE may include a plurality of branch electrodes PE1 defined by the openings OP, a first connection portion PE2, and a second connection portion PE3. The branch electrodes PE1 may have the same separation distance. The first and second connection portions PE2 and PE3 extend in the first direction D1. The first connection portion PE2 connects one ends of the branch electrodes PE1, whereas the second connection portion PE3 connect the other ends of the branch electrodes PE1.

The openings OP may have a bent shape corresponding to the plane shape of the connection portion DLc of the data line DLj. As illustrated in FIG. 5, a middle area and an end portion area of the openings OP may have a shape that is further inclined compared to the other area.

The common electrode CE to which the common voltage is applied may be arranged in the pixel PXa.

Although the drain electrode DE and the source electrode SE of the thin film transistor TFTc and the channel region of the semiconductor layer ACT are illustrated to have the plane shape of a left angle bracket "<", this is just an example, and they may have a plane shape of a right angle bracket ">" or a zigzag plane shape.

Figure 6:
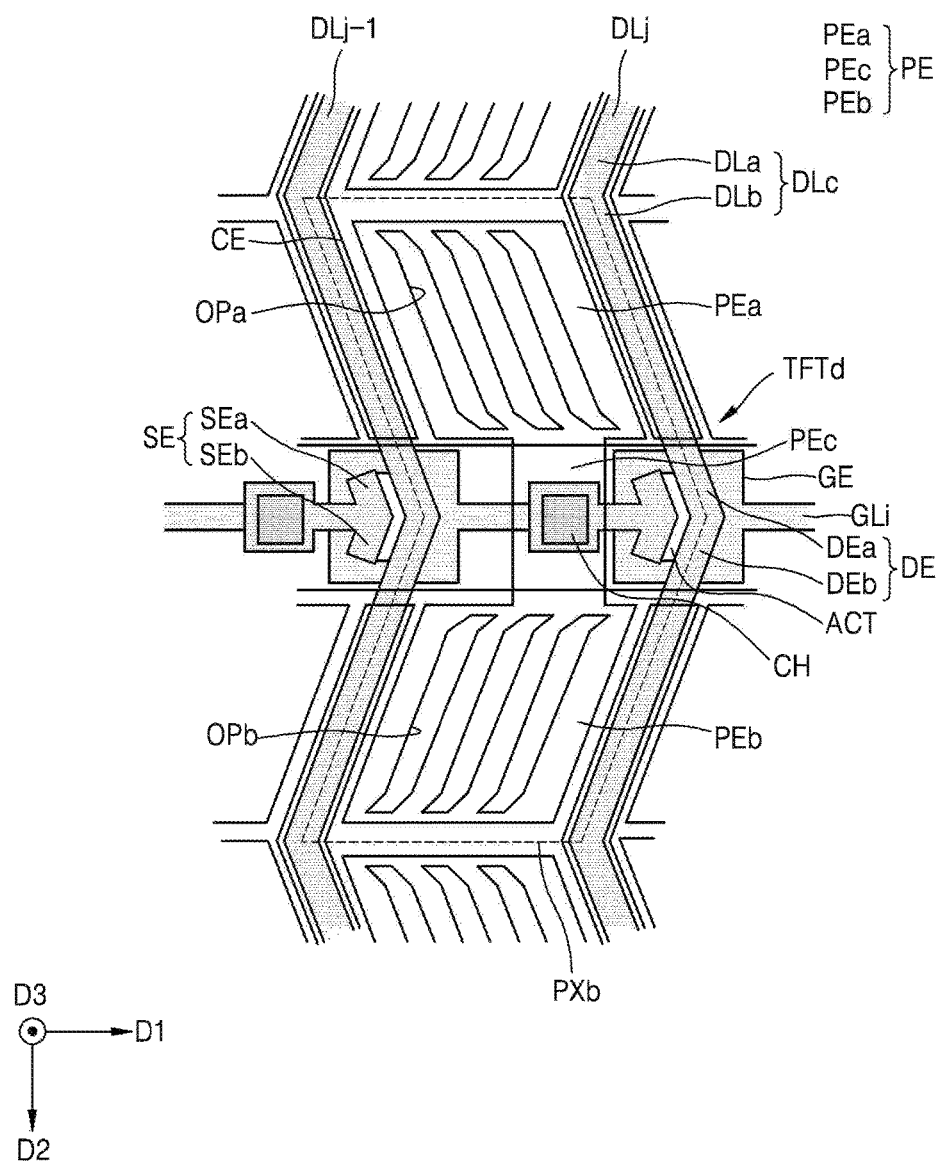
FIG. 6 is a plan view of a pixel including a TFT according to another embodiment.

FIG. 6 is a plan view of a pixel including a TFT according to another embodiment.

FIG. 6 illustrates an example of a single pixel PXb including a thin film transistor TFTd according to another embodiment. The pixel PXij of FIG. 2 may be replaced with the pixel PXb. The pixel PXb may have a structure similar to the pixel PXa of FIG. 5. In the following description, differences between the pixel PXb and the pixel PXa are mainly discussed and common descriptions thereof are omitted.

Referring to FIG. 6, the pixel PXb may include the thin film transistor TFTd and the pixel electrode PE. The pixel PXb is connected to the gate line GLi that extends in the first direction D1 and the data line DLj that extends in the second direction D2. In FIG. 6, the first direction D1 is defined to be a direction from the left to the right. While in FIG. 5 the gate line GLi is arranged across the end portion area of the pixel PXa, as illustrated in FIG. 6, the gate line GLi is arranged across the middle area of the pixel PXb.

The thin film transistor TFTd may include the gate electrode GE connected to the gate line GLi, the drain electrode DE connected to the data line DLj, the source electrode SE connected to the pixel electrode PE, and the semiconductor layer ACT for forming a channel of the thin film transistor TFTd.

The gate electrode GE may be a portion where a width increases, as a part of the gate line GLi. The gate line GLi electrically connects the gate electrodes GE of the thin film transistors TFTd arranged in the first direction D1.

The drain electrode DE may include the first drain oblique portion DEa extending in a direction between the first direction D1 and the second direction D2, and the second drain oblique portion DEb extending from the end portion of the first drain oblique portion DEa in the direction opposite to the first direction D1 and the second direction D2. As illustrated in FIG. 5, the plane shape of the drain electrode DE viewed in the third direction D3 may be a right angle bracket ">".

The drain electrode DE may be defined to be a part of the data line DLj at least partially overlapping the gate electrode GE. The data line DLj may be defined to include the connection portions DLc to connect the drain electrodes DE of the thin film transistors TFTd neighboring in the second direction D2. Accordingly, the data line DLj may include the drain electrodes DE and the connection portions DLc.

The data line DLj may have a bent shape to increase the aperture ratio of the display panel 100. The connection portion DLc may include the first data oblique portion DLa extending in a direction between the direction opposite to the first direction D1 and the second direction D2, and the second data oblique portion DLb extending in a direction between the first direction D1 and the second direction D2. In an embodiment, the first data oblique portion DLa may be inclined by about 7° with respect to the second direction D2, whereas the second data oblique portion DLb may be inclined by about −7° with respect to the second direction D2.

As illustrated in FIG. 6, the second drain oblique portion DEb may be a part obtained as the first data oblique portion DLa extends in the same direction, whereas the first drain oblique portion DEa may be a part obtained as the second data oblique portion DLb extends in the same direction. The second drain oblique portion DEb and the first data oblique portion DLa may be inclined at the same angle with respect to the second direction D2, whereas the first drain oblique portion DEa and the second data oblique portion DLb may be inclined at the same angle with respect to the second direction D2.

The source electrode SE is arranged spaced apart from the drain electrode DE above the gate electrode GE. The plane shape of the source electrode SE corresponds to the plane shape of the drain electrode DE, when viewed in the third direction D3, and may be arranged spaced apart from the drain electrode DE in the direction opposite to the first direction D1.

The source electrode SE may include the first source oblique portion SEa extending in a direction between the first direction D1 and the second direction D2 and the second source oblique portion SEb extending from the end portion of the first source oblique portion SEa in a direction between the direction opposite to the first direction D1 and the second direction D2. As illustrated in FIG. 5, the plane shape of the source electrode SE may be a right angle bracket ">" corresponding to the plane shape of the drain electrode DE.

The semiconductor layer ACT is arranged above the gate electrode GE at least partially overlapping the gate electrode GE. The semiconductor layer ACT may include a drain region to which the drain electrode DE is connected, a source region to which the source electrode SE is connected, and a channel region between the drain region and the source region.

The channel region may have a shape of a right angle bracket ">" corresponding to the plane shapes of the drain electrode DE and the source electrode SE. Accordingly, when the plane shape of the channel region is an angle bracket, a length of the thin film transistor TFTd in the second direction D2 may be reduced even if a channel width is the same, compared to a case of an "I" shape. Accordingly, the width of the non-pixel area NPA may be reduced and thus the aperture ratio of the display panel 100 may be improved.

The pixel electrode PE may include a first pixel electrode portion PEa, a second pixel electrode portion PEb, and a pixel connection portion PEc. The first and second pixel electrode portions PEa and PEb may be arranged in the pixel area PA, whereas the pixel connection portion PEc may be arranged in the non-pixel area NPA. The pixel connection portion PEc is connected to the source electrode SE of the thin film transistor TFTd via the contact hole CH. Furthermore, the pixel connection portion PEc connects the first pixel electrode portion PEa and the second pixel electrode portion PEb.

According to one embodiment, the thin film transistor TFTd is arranged in a center area of the pixel PXb. Furthermore, the gate line GLi may be arranged across the center area of the pixel PXb. The pixel connection portion PEc may be arranged in the center area of the pixel PXb.

The first pixel electrode portion PEa may have an inclined shape corresponding to the second data oblique portions DLb of the data lines DLj-1 and DLj. The second pixel electrode portion PEb may have an inclined shape corresponding to the first data oblique portions DLa of the data lines DLj-1 and DLj.

A plurality of first openings OPa may be formed in the first pixel electrode portion PEa. The first opening portion OPa may have an inclined slit shape corresponding to the second data oblique portions DLb of the data lines DLj-1 and DLj. The opposite end portions of the first opening portion OPa may be further inclined compared to a center portion thereof.

A plurality of second openings OPb may be formed in the second pixel electrode portion PEb. The second opening portion OPb may have an inclined slit shape corresponding to the first data oblique portions DLa of the data lines DLj-1 and DLj. The opposite end portions of the second opening portion OPb may be further inclined compared to a center portion thereof.

The common electrode CE to which a common voltage is applied may be arranged in the pixel PXb.

Figure 7:
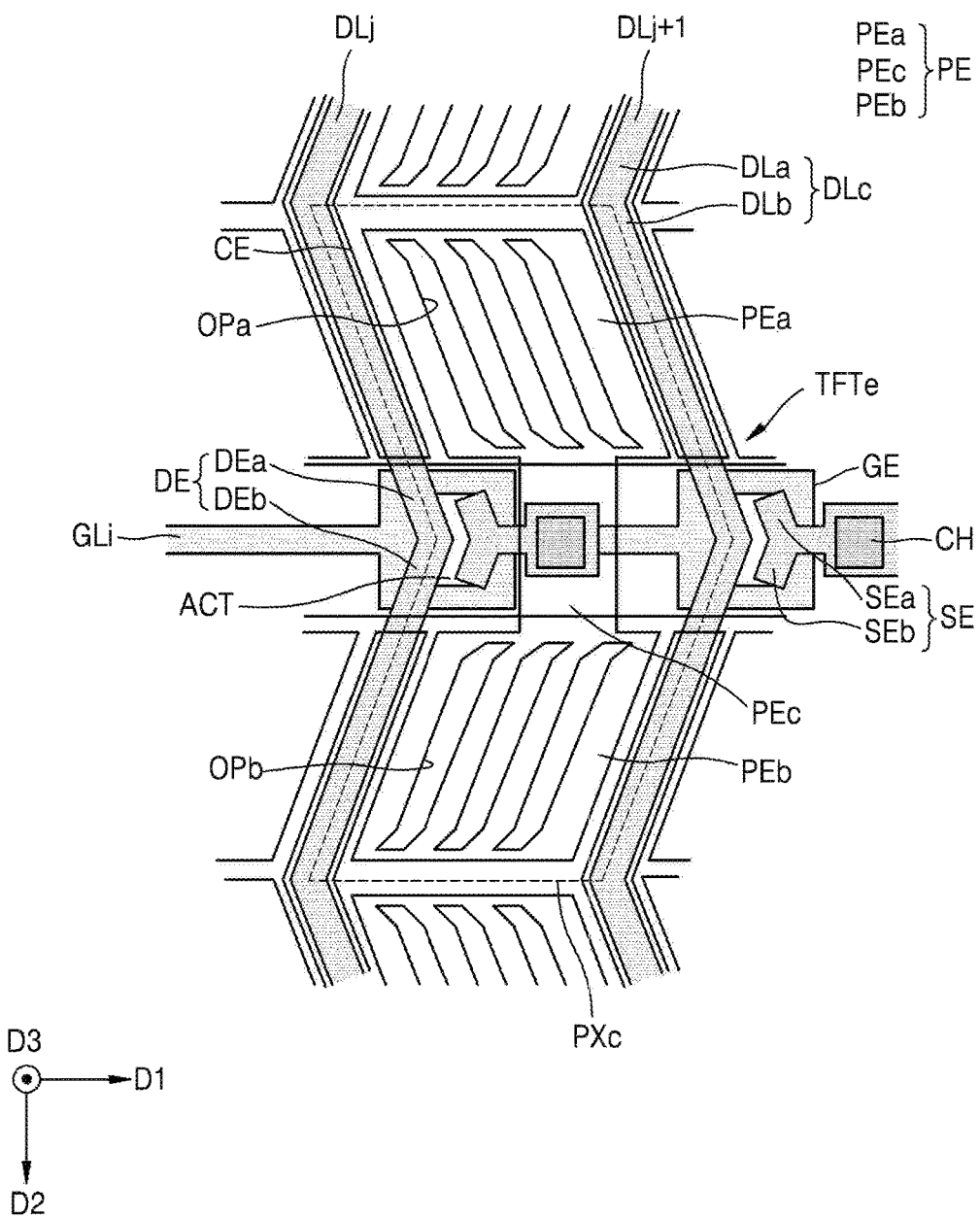
FIG. 7 is a plan view of a pixel including a TFT according to another embodiment.

FIG. 7 is a plan view of a pixel including a thin film transistor TFTe according to another embodiment.

FIG. 7 illustrates an example of a single pixel PXc including the thin film transistor TFTe according to another embodiment. The pixel PXij of FIG. 2 may be replaced with the pixel PXc. The pixel PXc may have a structure similar to the pixel PXb of FIG. 6. In the following description, differences between the pixel PXc and the pixel PXb are mainly discussed and common descriptions thereof are omitted.

Referring to FIG. 7, the pixel PXc may include the thin film transistor TFTe and the pixel electrode PE. The thin film transistor TFTe is connected to the gate line GLi extending in the first direction D1 and the data line DLj extending in the second direction D2.

The thin film transistor TFTe may include the drain electrode DE including the first drain oblique portion DEa and the second drain oblique portion Deb, and the source electrode SE including the first source oblique portion SEa and the second source oblique portion SEb.

Although in FIG. 6 the source electrode SE is arranged spaced apart from the drain electrode DE in the direction opposite to the first direction D1, according to one embodiment, the source electrode SE may be arranged spaced apart from the drain electrode DE the first direction D1 as illustrated in FIG. 7.

Figure 8:
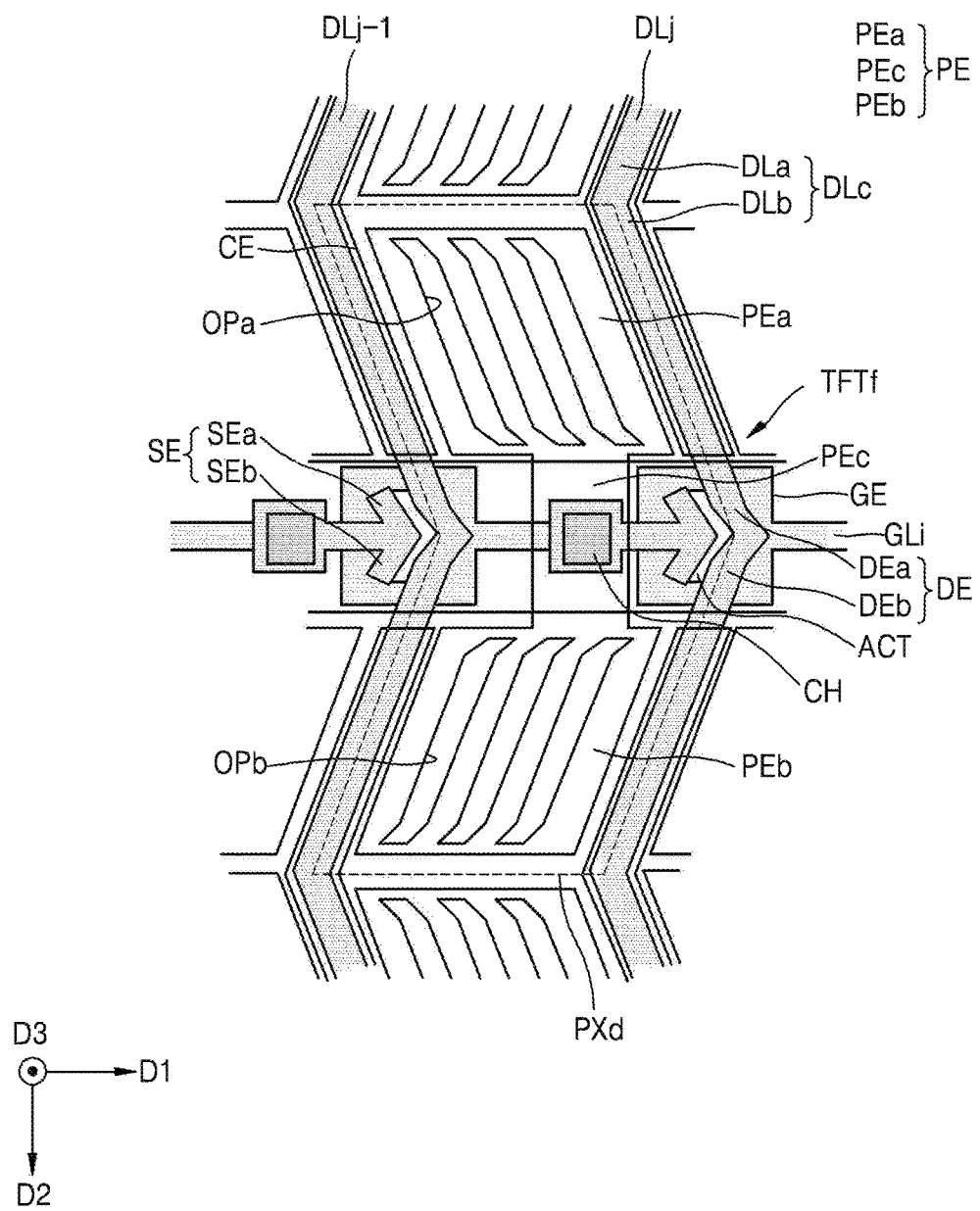
FIG. 8 is a plan view of a pixel including a TFT according to another embodiment.

FIG. 8 is a plan view of a pixel including a thin film transistor TFTf according to another embodiment.

FIG. 8 illustrates an example of a single pixel PXd including the thin film transistor TFTf according to another embodiment. The pixel PXij of FIG. 2 may be replaced with the pixel PXd. The pixel PXd may have a structure similar to the pixel PXb of FIG. 6. In the following description, differences between the pixel PXd and the pixel PXb are mainly discussed and common descriptions thereof are omitted.

Referring to FIG. 8, the pixel PXd may include the thin film transistor TFTf and the pixel electrode PE. The thin film transistor TFTf is connected to the gate line GLi extending in the first direction D1 and the data line DLj extending in the second direction D2. The data line DLj may include the connection portion DLc including the first data oblique portion DLa and the second data oblique portion DLb.

The thin film transistor TFTf may include the drain electrode DE including the first drain oblique portion DEa and the second drain oblique portion DEb, and the source electrode SE including the first source oblique portion SEa and the second source oblique portion SEb.

In FIG. 6, the angle between the direction in which the second drain oblique portion DEb extends and the second direction D2 is the same as the angle between the direction in which the first data oblique portion DLa extends and the second direction D2. The angle between the direction in which the first drain oblique portion DEa extends and the second direction D2 is the same as the angle between the direction in which the second data oblique portion DLb extends and the second direction D2. According to one embodiment, the drain electrode DE of the thin film transistor TFTf may be further bent compared to the connection portion DLc of the data line DLj. For example, the angle between the direction in which the second drain oblique portion DEb extends and the second direction D2 may be greater than the angle between the direction in which the first data oblique portion DLa extends and the second direction D2, and the angle between the direction in which the first drain oblique portion DEa extends and the second direction D2 may be greater than the angle between the direction in which the second data oblique portion DLb extends and the second direction D2.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate;
   a plurality of thin film transistors arranged in a first direction and a second direction above the substrate;
   a plurality of pixels arranged in the first direction and the second direction on the substrate; and
   a plurality of data lines each connected to thin film transistors arranged in the second direction among the plurality of thin film transistors;
   wherein each of the plurality of thin film transistors is included in a corresponding pixel among the plurality of pixels, and comprises:
      a gate electrode on the substrate;
      a drain electrode above the gate electrode, and comprising:
         a first drain oblique portion extending in a direction between the first direction and the second direction, and
         a second drain oblique portion extending from an end portion of the first drain oblique portion in a direction between a direction opposite to the first direction and the second direction;
      a source electrode spaced apart from the drain electrode above the gate electrode, and comprising:
         a first source oblique portion extending in the direction between the first direction and the second direction, and
         a second source oblique portion extending from an end portion of the first source oblique portion in a direction between the direction opposite to the first direction and the second direction; and
      a semiconductor layer at least partially overlapping the gate electrode, and comprising:
         a drain region to which the drain electrode is connected,
         a source region to which the source electrode is connected, and
         a channel region between the drain region and the source region,
   wherein each of the plurality of data lines includes connection parts and drain electrode parts, the drain electrode parts including the drain electrode of each of the thin film transistors arranged in the second direction,
   wherein each of connecting parts directly connects the second drain oblique portion of a first thin film transistor to the first drain oblique portion of a second thin film transistor adjacent to the first thin film transistor in the second direction.

2. The display apparatus of claim 1, wherein plane shapes of the drain electrode and the source electrode viewed in a third direction perpendicular to the first and second directions are a left angle bracket "<" or a right angle bracket ">".

3. The display apparatus of claim 1, wherein:
   the drain electrode further comprises a third drain oblique portion extending from an end portion of the second drain oblique portion in the direction between the first direction and the second direction, and
   the source electrode further comprises a first source oblique portion extending from an end portion of the second source oblique portion in the direction between the first direction and the second direction.

4. The display apparatus of claim 3, wherein plane shapes of the drain electrode and the source electrode viewed in the third direction perpendicular to the first and second directions are zigzag.

5. The display apparatus of claim 1, further comprising:
   a plurality of gate lines extending in the first direction and connecting gate electrodes of thin film transistors arranged in the first direction among the plurality of thin film transistors; and
   a plurality of data lines extending in the second direction and connecting drain electrodes of thin film transistors arranged in the second direction among the plurality of thin film transistors.

6. The display apparatus of claim 5, wherein:
   each of the plurality of data lines comprises a plurality of data linear portions linearly extending in the second direction, and
   each of the plurality of data linear portions is between drain electrodes of two neighboring thin film transistors among the plurality of transistors.

7. The display apparatus of claim 5, wherein:
   each of the plurality of data lines comprises a plurality of connection portions connecting drain electrodes of two neighboring thin film transistors among the plurality of thin film transistors in the second direction, and
   each of the plurality of connection portions comprises:
      a first data oblique portion extending from an end portion of a second drain oblique portion of a drain electrode of a first thin film transistor of the two neighboring thin film transistors in a direction opposite to the first direction and the second direction, and
      a second data oblique portion extending from an end portion of the first drain oblique portion to an end portion of a first drain oblique portion of a drain electrode of a second thin film transistor of the two neighboring thin film transistors in a direction between the first direction and the second direction.

8. The display apparatus of claim 7, wherein:
   an angle between a direction in which the second drain oblique portion extends and the second direction is greater than an angle between a direction in which the first data oblique portion extends and the second direction, and
   an angle between a direction in which the first drain oblique portion extends and the second direction is greater than an angle between a direction in which the second data oblique portion extends and the second direction.

9. The display apparatus of claim 7, wherein:
   an angle between a direction in which the second drain oblique portion extends and the second direction is the same as an angle between a direction in which the first data oblique portion extends and the second direction, and
   an angle between a direction in which the first drain oblique portion extends and the second direction is the same as an angle between a direction in which the second data oblique portion extends and the second direction.

10. The display apparatus of claim 1, wherein:
    a plane shape of the drain electrode viewed in a third direction perpendicular to the first and second directions corresponds to a plane shape of the source electrode viewed in the third direction, and the source electrode is spaced apart from the drain electrode in the first direction.

11. The display apparatus of claim 1, wherein:

a plane shape of the drain electrode viewed in a third direction perpendicular to the first and second directions corresponds to a plane shape of the source electrode viewed in the third direction, and the source electrode is spaced apart from the drain electrode in a direction opposite to the first direction.

12. The display apparatus of claim 1, wherein each of the plurality of thin film transistors is arranged in a center area of a pixel corresponding to the thin film transistor among the plurality of pixels.

13. The display apparatus of claim 1, further comprising:

a plurality of pixel electrodes respectively connected to source electrodes of the plurality of thin film transistors and included in the plurality of pixels; and a liquid crystal layer on the plurality of pixel electrodes.

14. The display apparatus of claim 1, wherein an angle between a direction in which each of the first and second drain oblique portions and the first and second source oblique portions extends and the second direction is between about 30° and about 60°.

15. The display apparatus of claim 1, wherein the connection parts and the drain electrode parts are alternately extended.

16. A display apparatus comprising:

a substrate;

a plurality of thin film transistors arranged in a first direction and a second direction above the substrate;

a plurality of pixels comprising the plurality of thin film transistors;

a plurality of gate lines extending in the first direction and connecting gate electrodes of thin film transistors arranged in the first direction among the plurality of thin film transistors; and a plurality of data lines extending in the second direction and connecting drain electrodes of thin film transistors arranged in the second direction among the plurality of thin film transistors, wherein each of the plurality of thin film transistors comprises:

a gate electrode on the substrate;

a drain electrode above the gate electrode, and comprising:

a first drain oblique portion extending in a direction between the first direction and the second direction, and a second drain oblique portion extending from an end portion of the first drain oblique portion in a direction between a direction opposite to the first direction and the second direction;

a source electrode spaced apart from the drain electrode above the gate electrode, and comprising:

a first source oblique portion extending in the direction between the first direction and the second direction, and a second source oblique portion extending from an end portion of the first source oblique portion in a direction between the direction opposite to the first direction and the second direction; and a semiconductor layer at least partially overlapping the gate electrode, and comprising:

a drain region to which the drain electrode is connected, a source region to which the source electrode is connected, and a channel region between the drain region and the source region, wherein the plurality of gate lines connect gate electrodes of thin film transistors arranged in the first direction among the plurality of thin film transistors, and the plurality of data lines connect drain electrodes of thin film transistors arranged in the second direction among the plurality of thin film transistors wherein each of the plurality of data lines comprises a plurality of connection portions connecting drain electrodes of two neighboring thin film transistors among the plurality of thin film transistors in the second direction.

17. The display apparatus of claim 16, wherein each of the plurality of connection portions comprises:

a first data oblique portion extending from an end portion of a second drain oblique portion of a drain electrode of a first thin film transistor of the two neighboring thin film transistors in a direction opposite to the first direction and the second direction, and a second data oblique portion extending from an end portion of the first drain oblique portion to an end portion of a first drain oblique portion of a drain electrode of a second thin film transistor of the two neighboring thin film transistors in a direction between the first direction and the second direction.

18. The display apparatus of claim 17, wherein:

an angle between a direction in which the second drain oblique portion extends and the second direction is greater than an angle between a direction in which the first data oblique portion extends and the second direction, and an angle between a direction in which the first drain oblique portion extends and the second direction is greater than an angle between a direction in which the second data oblique portion extends and the second direction.

19. The display apparatus of claim 17, wherein:

an angle between a direction in which the second drain oblique portion extends and the second direction is the same as an angle between a direction in which the first data oblique portion extends and the second direction, and an angle between a direction in which the first drain oblique portion extends and the second direction is the same as an angle between a direction in which the second data oblique portion extends and the second direction.

* * * * *